(12) United States Patent
Jeong et al.

(10) Patent No.: US 10,741,448 B2
(45) Date of Patent: Aug. 11, 2020

(54) METHOD OF SINGULATING SEMICONDUCTOR DIE AND METHOD OF FABRICATING SEMICONDUCTOR PACKAGE

(71) Applicant: Samsung Electronics Co., Ltd., Suwon-si (KR)

(72) Inventors: Byong-gook Jeong, Anyang-si (KR); Byung-ho Kim, Cheonan-si (KR); Youn-jo Mun, Cheonan-si (KR); Jeong-cheol An, Cheonan-si (KR); Sung-il Cho, Asan-si (KR); Dae-sang Chun, Asan-si (KR); Man-hee Han, Cheonan-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/297,950

(22) Filed: Mar. 11, 2019

(65) Prior Publication Data

US 2019/0279904 A1 Sep. 12, 2019

(30) Foreign Application Priority Data

Mar. 9, 2018 (KR) .................. 10-2018-0028238

(51) Int. Cl.
*H01L 21/78* (2006.01)
*H01L 21/02* (2006.01)
*H01L 21/268* (2006.01)

(52) U.S. Cl.
CPC ........ *H01L 21/78* (2013.01); *H01L 21/02348* (2013.01); *H01L 21/02362* (2013.01); *H01L 21/268* (2013.01)

(58) Field of Classification Search
None
See application file for complete search history.

(56) References Cited

U.S. PATENT DOCUMENTS

| 7,602,071 | B2 | 10/2009 | Ohmiya et al. |
| 9,484,210 | B2 | 11/2016 | Burghout et al. |
| 10,008,405 | B2 | 6/2018 | Iwanaga et al. |

(Continued)

FOREIGN PATENT DOCUMENTS

| JP | 2007022876 A | 2/2007 |
| JP | 2007067278 A | 3/2007 |

(Continued)

*Primary Examiner* — Asok K Sarkar
(74) *Attorney, Agent, or Firm* — Muir Patent Law, PLLC

(57) ABSTRACT

A method of fabricating a semiconductor package includes providing a substrate on a stage, the substrate including semiconductor dies and a modified layer along a partition lane and sequentially having an adhesive film and a base film on a surface thereof so that bottom surfaces of the adhesive film and the base film face the stage and top surfaces of the adhesive film and the base film face away from the stage and the bottom surface of the adhesive film faces the top surface of the base film; separating the semiconductor dies from each other by applying a force to the substrate in a lateral direction; applying a gas pressure to a top surface of each of the semiconductor dies; and irradiating ultraviolet rays toward the adhesive film after applying the gas pressure on the top surface of each of the semiconductor dies.

20 Claims, 8 Drawing Sheets

(56) References Cited

U.S. PATENT DOCUMENTS

| | | | | |
|---|---|---|---|---|
| 2011/0104873 A1* | 5/2011 | Kamiya | .................... | C08F 8/30 |
| | | | | 438/464 |
| 2011/0220268 A1* | 9/2011 | Nishio | ...................... | B32B 7/12 |
| | | | | 156/85 |
| 2013/0122688 A1* | 5/2013 | Sasaki | .................... | H01L 21/78 |
| | | | | 438/463 |
| 2017/0345715 A1* | 11/2017 | Harikai | ................... | H01L 21/78 |
| 2018/0185964 A1* | 7/2018 | Yokoi | .................... | C09J 201/00 |
| 2019/0057891 A1* | 2/2019 | Marinov | ............... | H01L 21/304 |

FOREIGN PATENT DOCUMENTS

| | | | |
|---|---|---|---|
| JP | 2009272503 A | 11/2009 | |
| JP | 2010153692 A | 7/2010 | |
| JP | 2013258236 A | 12/2013 | |
| KR | 10-2006-0093036 A | 8/2006 | |
| KR | 10-2013-0111292 A | 10/2013 | |
| KR | 10-2015-0087347 A | 7/2015 | |

\* cited by examiner

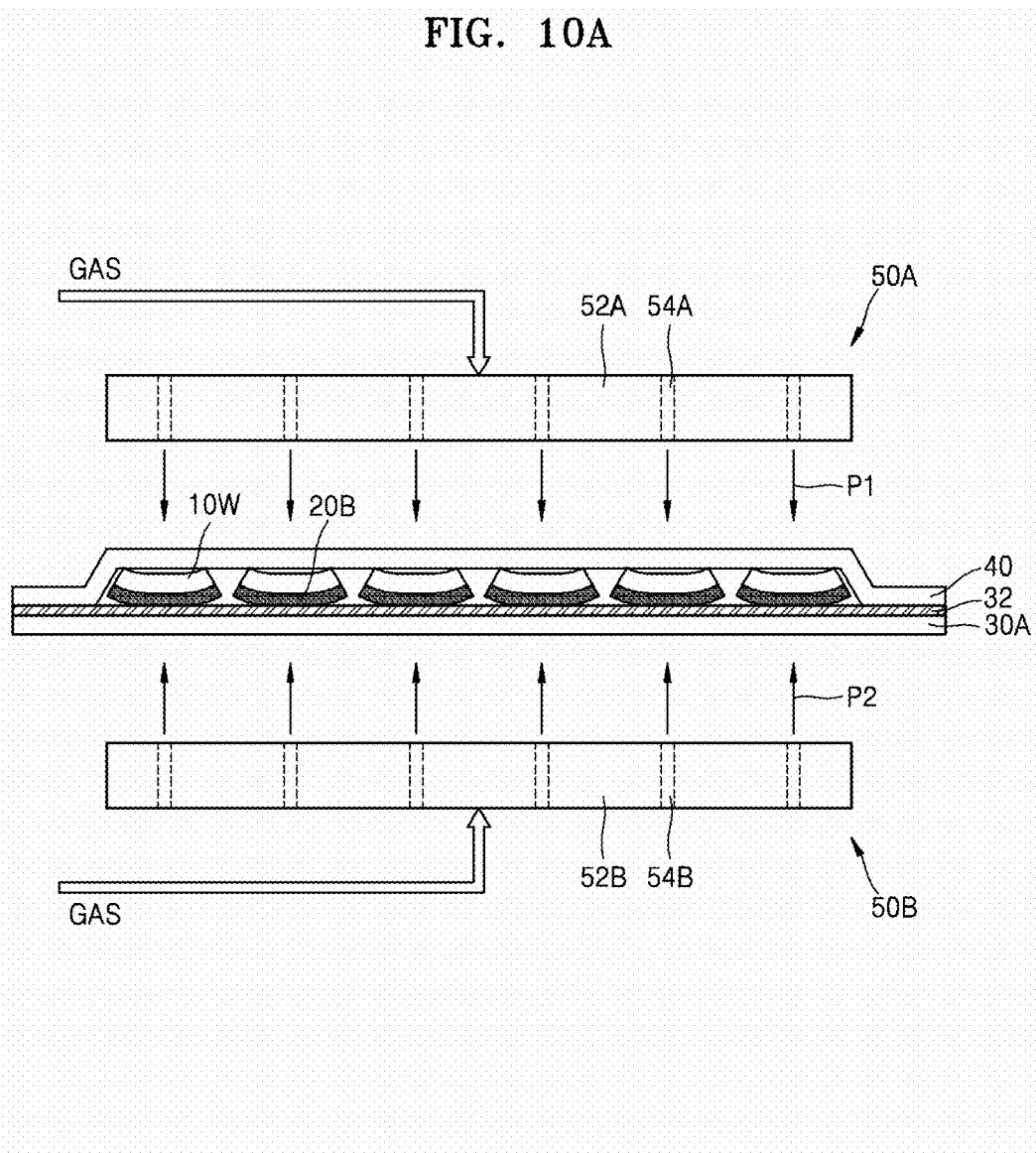

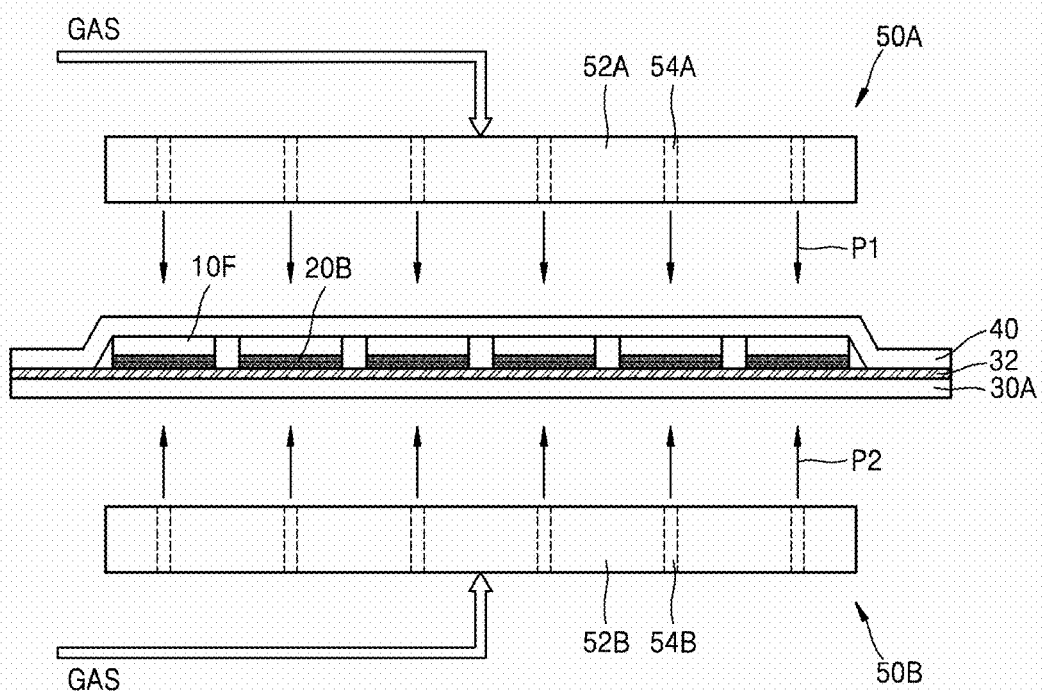

METHOD OF SINGULATING SEMICONDUCTOR DIE AND METHOD OF FABRICATING SEMICONDUCTOR PACKAGE

CROSS-REFERENCE TO RELATED APPLICATION

This application claims the benefit of priority under 35 U.S.C. § 119 to Korean Patent Application No. 10-2018-0028238, filed on Mar. 9, 2018, in the Korean Intellectual Property Office, the disclosure of which is incorporated herein in its entirety by reference.

BACKGROUND

Example embodiments according to the inventive concept relate to a method of singulating a semiconductor die and a method of fabricating a semiconductor package, and more particularly, to a method of singulating a semiconductor die and a method of fabricating a semiconductor package, by which device reliability is increased and a failure rate is decreased.

A decrease in the thickness of a semiconductor device used in an electronic product may create difficulties in handling the semiconductor device during various processes. In particular, warpage of a semiconductor wafer or die may cause many problems, and thus, there is a need for a technique to address these problems.

SUMMARY

Example embodiments according to the inventive concept provide a method of fabricating a semiconductor package, by which device reliability is increased and a failure rate is decreased.

Example embodiments according to the inventive concept also provide a method of singulating a semiconductor die, by which device reliability is increased and a failure rate is decreased.

According to an aspect of the inventive concept, there is provided a method of fabricating a semiconductor package, the method including providing a substrate on a stage, the substrate including semiconductor dies and a modified layer along a partition lane and sequentially having an adhesive film and a base film on a surface thereof; separating semiconductor dies from each other by applying a force to the substrate in a lateral direction; applying a pressure to tops of the semiconductor dies with gas to enable the semiconductor dies and the adhesive film to be in close contact with the base film; and radiating ultraviolet rays toward the adhesive film.

According to another aspect of the inventive concept, there is provided a method of singulating semiconductor dies, the method including providing a substrate on a stage, the substrate including semiconductor dies and a modified layer along a partition lane and sequentially having an adhesive film and a base film on a surface thereof so that bottom surfaces of the adhesive film and the base film face the stage and top surfaces of the adhesive film and the base film face away from the stage and the bottom surface of the adhesive film faces the top surface of the base film; separating the semiconductor dies from each other by applying a force to the substrate in a lateral direction; applying a gas pressure to a top surface of each of the semiconductor dies; and irradiating ultraviolet rays toward the adhesive film after applying the gas pressure on the top surface of each of the semiconductor dies.

According to a further aspect of the inventive concept, there is provided a method of singulating semiconductor dies for fabricating a semiconductor package, the method including separating the semiconductor dies from each other in a substrate by applying a force to the substrate in a lateral direction, the substrate including a modified layer along a partition lane and the semiconductor dies which have not been separated from each other yet; after the separating, covering the semiconductor dies with a protective film; and applying a gas pressure to a top surface of the protective film to apply the gas pressure to the semiconductor dies.

According to a further aspect of the inventive concept, there is provided a method of singulating semiconductor dies for fabricating a semiconductor package, the method including forming a modified layer along a partition lane of a substrate including semiconductor dies which have not been separated from each other; sequentially attaching an adhesive film and a base film to a surface of the substrate so that a bottom surface of the adhesive film faces a top surface of the base film; separating the semiconductor dies from each other by applying a force to the substrate in a lateral direction; applying a gas pressure to the semiconductor dies to reduce or remove warpage spontaneously occurring in the semiconductor dies separated in the separating of the semiconductor dies; irradiating ultraviolet rays toward the adhesive film after applying the gas pressure to the semiconductor dies; and separating the adhesive film from the base film.

BRIEF DESCRIPTION OF THE DRAWINGS

Embodiments of the inventive concept will be more clearly understood from the following detailed description taken in conjunction with the accompanying drawings in which:

FIGS. 10A and 10B are lateral views for explaining a method of singulating semiconductor dies, according to an example embodiment of the inventive concept;

DETAILED DESCRIPTION

Figure 1:
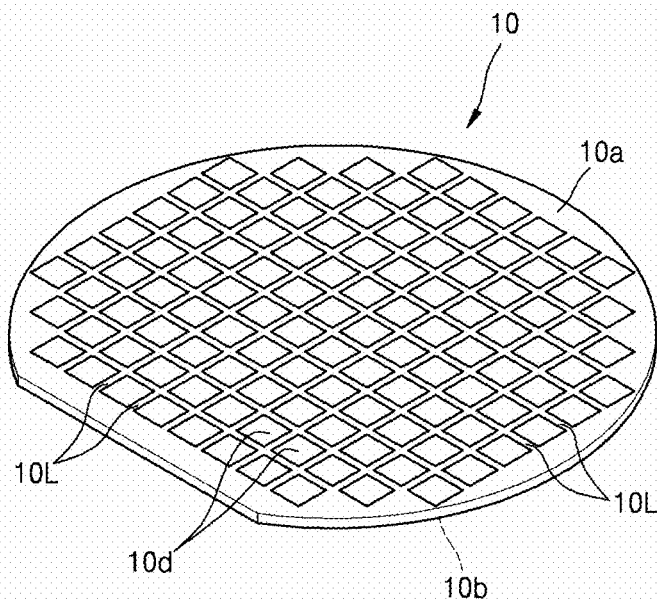
FIG. 1 is a perspective view of a semiconductor substrate to be singulated according to an example embodiment of the inventive concept.

FIG. 1 is a perspective view of a semiconductor substrate 10 including semiconductor dies 10d to be singulated according to an example embodiment of the inventive concept.

Referring to FIG. 1, the semiconductor substrate 10 may include silicon (Si), e.g., monocrystalline Si, polycrystalline Si, or amorphous Si. In some embodiments, the semiconductor substrate 10 may include a semiconductor such as germanium (Ge) or a compound semiconductor such as silicon germanium (SiGe), silicon carbide (SiC), gallium arsenide (GaAs), indium arsenide (InAs), or indium phosphide (InP). In this exemplary embodiment, it is assumed that the semiconductor substrate 10 is monocrystalline Si, but it will be understood by one of ordinary skill in the art that the same or similar descriptions may refer to other kinds of semiconductor substrates.

A plurality of partition lanes 10L may be formed in a lattice pattern on a first surface 10a of the semiconductor substrate 10. A semiconductor device may be formed in each of a plurality of regions divided by the partition lanes 10L on the first surface 10a of the semiconductor substrate 10. The regions are semiconductor dies 10d to be separated. The "semiconductor device" may refer to an integrated circuit formed on a semiconductor substrate, and also may refer to the device formed by the combined semiconductor wafer and integrated circuit, which form a chip or die. The term "semiconductor device" as used herein may also refer to a semiconductor package, including a package substrate, one or more semiconductor chips, and an encapsulant.

The semiconductor substrate 10 may have a thickness of about 20 μm to about 50 μm. The semiconductor substrate 10 may become thicker right after semiconductor devices are formed and may be processed to have a thickness of about 20 μm to about 50 μm through thinning.

The first surface 10a on which the semiconductor devices have been formed may be referred to as an active surface. In some embodiments, semiconductor devices may not be formed on a second surface 10b opposite the first surface 10a. In some exemplary embodiments, a contact plug electrically connected to a semiconductor device or a bonding pad may be exposed in the second surface 10b. The contact plug may be, for example, conductive plug formed of a conductive material such as a metal. The bonding pad of a device described herein may be a conductive terminal connected to internal wiring and/or logic circuits of the device, and may transmit signals and/or supply voltages between an internal wiring and/or internal circuit of the device and an external source.

Figure 2A:
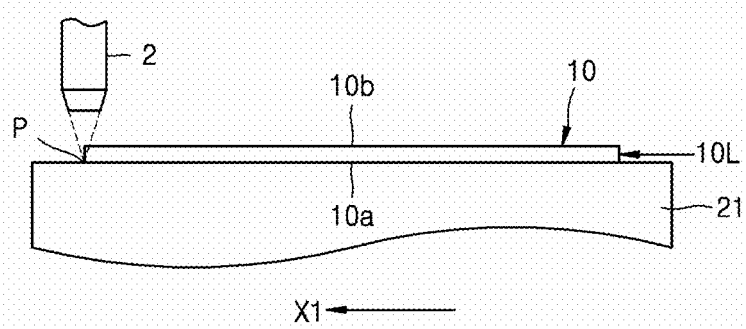
FIGS. 2A and 2B are schematic diagrams for explaining a method of forming a modified layer along a partition lane according to an example embodiment of the inventive concept.
Figure 2B:
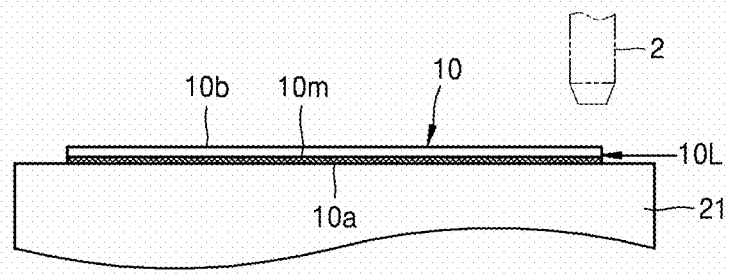

FIGS. 2A and 2B are schematic diagrams for explaining a method of forming a modified layer 10m along a partition lane 10L.

Referring to FIGS. 2A and 2B, the modified layer 10m may be formed by radiating laser light using a laser irradiation apparatus 2. In an exemplary embodiment, the modified layer 10m may be formed in the semiconductor substrate 10 along the partition lane 10L by radiating a pulsed laser beam capable of penetrating the semiconductor substrate 10 along the partition lane 10L.

The semiconductor substrate 10 may be positioned on a chuck table 21 such that the second surface 10b of the semiconductor substrate 10 faces upward. The chuck table 21 may hold the semiconductor substrate 10 by suction. For example, the chuck table 21 may include a plurality of vacuum suction holes (not shown) in a central part and edge portions of the chuck table 21 forming a vacuum region between the first surface 10a of the semiconductor substrate 10 and an upper surface of the chuck table 21 so that the semiconductor substrate 10 may be stably held to the upper surface of the chuck table 21 by a vacuum adsorption method.

The semiconductor substrate 10, and more particularly, the partition lane 10L may be aligned with the laser irradiation apparatus 2. The alignment may be performed by a controller (not shown) included in the laser irradiation apparatus 2.

In a state where one end of the partition lane 10L is positioned below the laser irradiation apparatus 2, the semiconductor substrate 10 may be relatively moved with respect to the laser irradiation apparatus 2 at a predetermined speed in an X1 direction (a direction parallel to the first surface 10a of the semiconductor substrate 10) in FIG. 2A while a pulsed laser beam capable of penetrating the semiconductor substrate 10 is irradiated to the semiconductor substrate 10.

A converging point P of the pulsed laser beam may be focused at the first surface 10a of the semiconductor substrate 10. As a result, as shown in FIG. 2B, the modified layer 10m may be exposed through the first surface 10a and also formed to a predetermined thickness from the first surface 10a toward the second surface 10b.

The modified layer 10m may be a region in which silicon included in the semiconductor substrate 10 is melted and resolidified. According to exemplary embodiments, the semiconductor substrate 10 is a monocrystalline Si substrate, but the modified layer 10m may include a polycrystalline Si substrate and/or an amorphous Si substrate. Since a crystal structure is different in the modified layer 10m, the semiconductor substrate 10 may undergo a volume change, and therefore, a crack may occur along the partition lane 10L. Accordingly, semiconductor dies may be easily singulated along the partition lane 10L when an external force is applied afterward.

Referring to FIG. 2B, when the other end of the partition lane 10L reaches below the laser irradiation apparatus 2, the relative motion between the laser irradiation apparatus 2 and the semiconductor substrate 10 may stop.

The laser irradiation apparatus 2 may include a YAG laser oscillator or a YVO4 laser oscillator, but the inventive concept is not limited thereto.

Examples of laser processing conditions which may be used are as follows.

Example 1 light source: LD excitation Q-switch Nd:YVO4 laser
wavelength: 1064-nm pulsed laser
pulse output: 10 microjoules
diameter of converging spot: 1 micrometer
repetition frequency: 100 kHz
moving speed: 100 mm/s

Example 2 light source: LD excitation Q-switch Nd:YAG laser
wavelength: 1064-nm pulsed laser pulse output: 20 microjoules
diameter of converging spot: 1 micrometer
repetition frequency: 100 kHz
moving speed: 100 mm/s.

Figure 3:
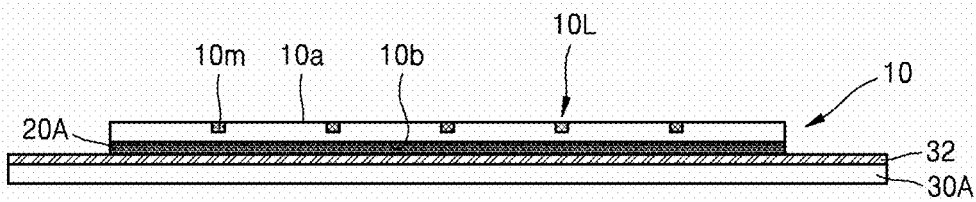
FIG. 3 is a cross-sectional view of a stage on which an adhesive film and a base film are sequentially added to the semiconductor substrate in which the modified layer has been formed according to an example embodiment of the inventive concept.

FIG. 3 is a cross-sectional view of a stage on which an adhesive film 20A and a base film 30A are sequentially added to the semiconductor substrate 10 in which the modified layer 10m has been formed.

Referring to FIG. 3, the adhesive film 20A is referred to as a die attach film (DAF) and may be attached to the second surface 10b of the semiconductor substrate 10.

The base film 30A may be attached to the adhesive film 20A. The base film 30A may include a polymer of polyolefin series such as polyethylene (PE), polyvinyl chloride (PVC), polyethylene terephthalate (PET), and polypropylene (PP). In particular, the base film 30A may have elasticity such that the base film 30A may be expandable in a lateral direction, i.e., a direction parallel to a top surface of the base film 30A.

The base film 30A may include an adhesive releasing layer 32 at a surface contacting the adhesive film 20A. For example, the base film 30A may contact the adhesive film 20A through the adhesive releasing layer 32. The adhesive releasing layer 32 may bond the base film 30A to the adhesive film 20A and allow the base film 30A to be easily detached from the adhesive film 20A by ultraviolet (UV) exposure. The adhesive releasing layer 32 may include a photoinitiator which is activated by UV exposure and initiates a reaction decreasing adhesion.

The adhesive film 20A and the base film 30A may be commercial films.

While the partition lane 10L is expanded in a left-and-right direction in FIG. 2B, the partition lane 10L is expanded in the direction of a line of sight in FIG. 3. However, since the partition lanes 10L extend crossing one another in a lattice pattern as shown in FIG. 1, partition lanes 10L that are expanded in the left-and-right direction exist in the semiconductor substrate 10 in the line of sight in FIG. 3 although not directly shown.

Figure 4:
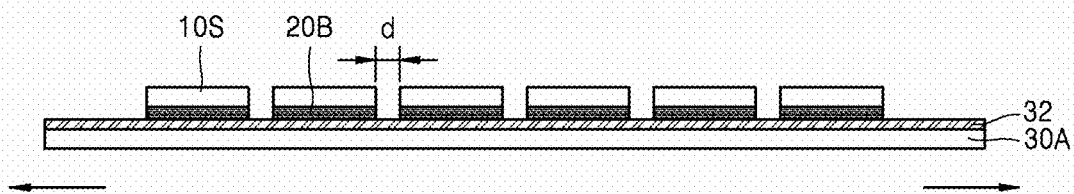
FIG. 4 is a lateral cross-sectional view of a stage on which semiconductor dies are singulated by expanding the base film in a lateral direction.

FIG. 4 is a lateral cross-sectional view of a stage on which semiconductor dies 10S are singulated by expanding the base film 30A in the lateral direction, i.e., the direction parallel to the top surface of the base film 30A.

Referring to FIG. 4, when the base film 30A is expanded, lateral stress may be applied to the semiconductor substrate 10. A crack formed in the modified layer 10m may propagate in the thickness direction (i.e., a direction perpendicular to the top surface of the base film 30A) of the semiconductor substrate 10 due to the lateral stress. The crack has been described above with reference to FIGS. 2A and 2B. Thus, the semiconductor dies may be separated from each other by applying a force (e.g., lateral stress) to the semiconductor substrate 10 in a lateral direction.

Expansion of the base film 30A may be performed at a temperature lower than room temperature. In an exemplary embodiment, the base film 30A may be expanded at a relatively lower temperature of about −20° C. to about 10° C., about −15° C. to about 5° C., about −15° C. to about 0° C., or about −15° C. to about −10° C. The expansion of the base film 30A is performed at the relatively lower temperature because disruption of the adhesive film 20A may be increased if the expansion of the base film 30A is performed at a temperature higher than 10° C.

The base film 30A may be expanded by a length of about 1 mm to about 9 mm, about 1.5 mm to about 7 mm, about 2 mm to about 6 mm, or about 3 mm to about 5 mm, but the inventive concept is not limited thereto.

A distance "d" in a direction parallel to the top surface of the base film 30A between adjacent semiconductor dies 10S may be substantially regular. The distance "d" may vary with the amount of lateral expansion of the base film 30A. The distance "d" may be greater than the width of the partition lanes 10L.

In an exemplary embodiment, the distance "d" may be about 10 μm to about 100 μm, about 30 μm to about 80 μm, or about 50 μm to about 70 μm, but the inventive concept is not limited thereto.

To apply lateral stress to the semiconductor substrate 10, the base film 30A may be expanded in the lateral direction using various methods. For example, in some embodiments, the semiconductor substrate 10 may be lifted upward in a state where the edge of the base film 30A is fixed. In this exemplary embodiment, the base film 30A may be expanded in the lateral direction in proportional to the amount of lift of the semiconductor substrate 10, and therefore, lateral stress may be applied to the semiconductor substrate 10.

Figure 5:
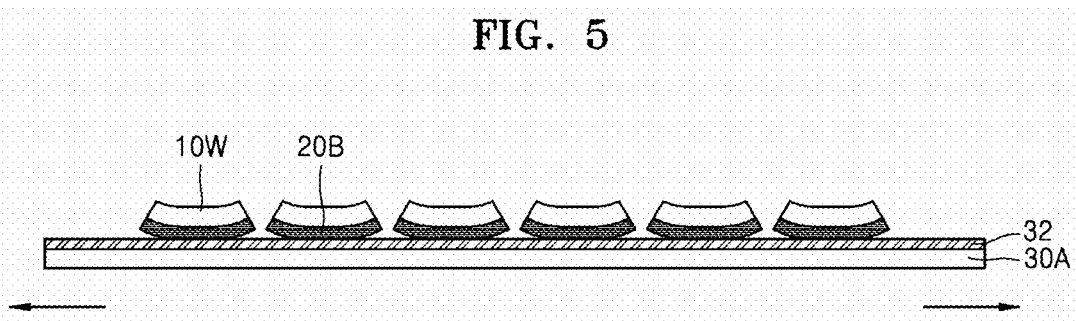
FIG. 5 is a lateral view of a stage on which warpage occurs in the singulated semiconductor dies and the adhesive film.

FIG. 5 is a lateral view of a stage on which warpage occurs in semiconductor dies 10W, which have been singulated, and an adhesive film 20B.

Referring to FIG. 5, warpage may spontaneously occur in the semiconductor dies 10W due to various causes. In an exemplary embodiment, the warpage may occur because the influence of stress caused by metal wires in active surfaces (i.e., top surfaces in FIG. 5) of the semiconductor dies 10W increases as the semiconductor dies 10W become very thin.

In another exemplary embodiment, the warpage may occur because the adhesive film 20A is not expanded while the base film 30A is expanded in the lateral direction. For example, the base film 30A and the adhesive film 20A may be flatly bonded to each other before the base film 30A is expanded. However, when the base film 30A is expanded in a horizontal direction, with the size of the adhesive film 20A being constant, stress occurs in the bonding interface between the base film 30A and the adhesive film 20A, and therefore, warpage may occur.

Figure 6:
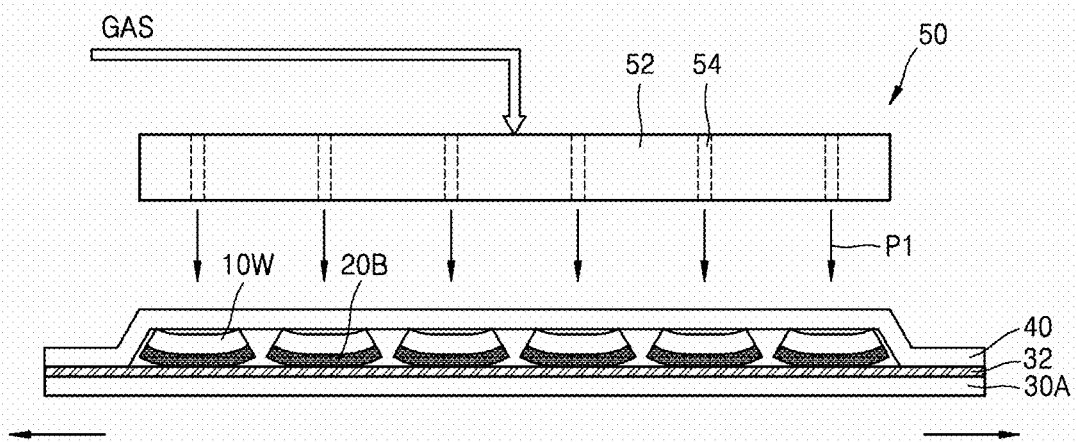
FIG. 6 is a lateral view of a stage on which a protective film is provided above the semiconductor dies and the adhesive film in which warpage occurs according to an example embodiment of the inventive concept.

FIG. 6 is a lateral view of a stage on which a protective film 40 is provided above the semiconductor dies 10W and the adhesive film 20B in which warpage occurs.

Referring to FIG. 6, the protective film 40 may be provided to cover the semiconductor dies 10W and the adhesive film 20B, which have the warpage.

The protective film 40 may not be rigid but may have flexibility. The protective film 40 may readily transmit pressure from above to below. The protective film 40 may include polymer resin such as PE, PP, PET, or polystyrene.

A gas injection system 50 which sprays gas onto the protective film 40 may be provided above the protective film 40. Gas may be supplied to the gas injection system 50. The gas may be discharged toward the protective film 40 through nozzles 54 formed in a body 52 of the gas injection system 50.

The discharged gas may apply pressure to the protective film 40. Since the protective film 40 has flexibility, the protective film 40 may readily transmit the pressure to the semiconductor dies 10W and the adhesive film 20B, which are located below the protective film 40. In particular, when a film having relatively high flexibility is selected as the protective film 40 (e.g. a film that is bendable and not rigid), when the discharged gas applies pressure to the protective film 40, the protective film 40 may come in close contact with the surfaces of the semiconductor dies 10W, and therefore, the pressure may be more effectively transmitted. For example, when a film having relatively high flexibility is selected as the protective film 40 and when the discharged gas applies pressure to the protective film 40, the protective film 40 may contact a relatively higher percentage of the surfaces of the semiconductor dies 10W compared to when a film having relatively low flexibility is selected as the protective film 40. For example, when a film having relatively high flexibility is selected as the protective film 40, the protective film 40 may contact about 75% or more of the surfaces of the semiconductor dies 10W when pressure is applied to the protected film 40 by the gas discharged from the gas nozzles 54 and when a film having relatively low flexibility (e.g., relatively rigid) is selected as the protective film 40, the protective film 40 may contact about 50% or less of the surfaces of the semiconductor dies 10W when pressure is applied to the protected film 40 by the gas discharged from the gas nozzles 54.

The gas that is sprayed may be air or a gas, such as nitrogen ($N_2$), carbon dioxide ($CO_2$), helium (He), neon (Ne), or argon (Ar), which is chemically low-active or inert.

Although the protective film 40 covers the semiconductor dies 10W in FIG. 6, the protective film 40 may be omitted in some example embodiments. When the protective film 40 is omitted, gas sprayed by the gas injection system 50 may directly apply pressure to the top surfaces of the semiconductor dies 10W.

When the protective film 40 is used as shown in FIG. 6, the distribution of pressure applied to the semiconductor dies 10W may be more uniform and the warpage of the semiconductor dies 10W and the adhesive film 20B may be reduced or alleviated by the gas sprayed from the gas injection system 50. When the protective film 40 is omitted differently from FIG. 6, the semiconductor dies 10W positioned respectively corresponding to the nozzles 54 may receive higher pressure and the warpage of the semiconductor dies 10F and the adhesive film 20B may be reduced or alleviated by the gas sprayed from the gas injection system 50. However, when the protective film 40 is omitted differently from FIG. 6, the percentage of warpage reduction of the semiconductor dies 10F and the adhesive film 20B may be less than the percentage of warpage reduction of the semiconductor dies 10F and the adhesive film 20B when the protective film 40 is used as shown in FIG. 6.

Figure 7:
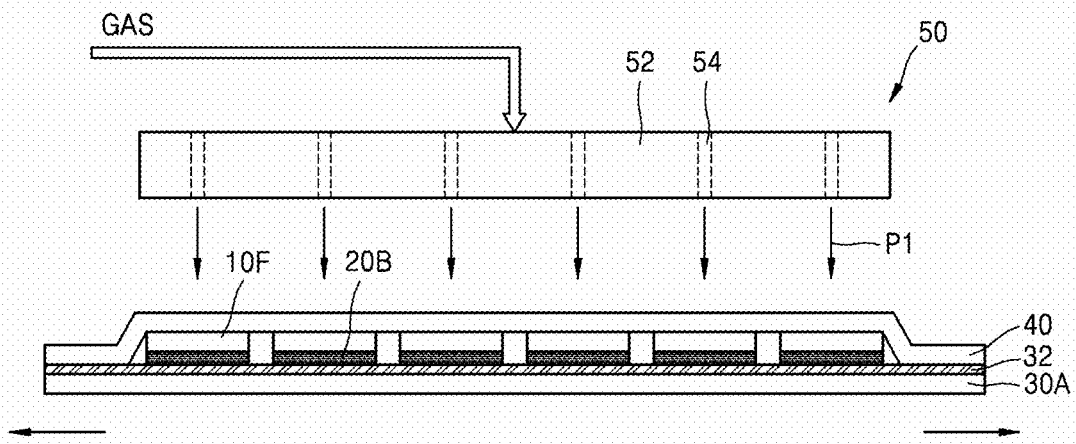
FIG. 7 is a lateral view of a stage after the warpage of the semiconductor dies and adhesive film is alleviated.

FIG. 7 is a lateral view of a stage after warpage of semiconductor dies 10F and the adhesive film 20B is alleviated.

Referring to FIG. 7, the warpage of the semiconductor dies 10F and the adhesive film 20B may be reduced or alleviated by the gas sprayed from the gas injection system 50. Accordingly, detachment of the semiconductor dies 10F and the adhesive film 20B from the base film 30A may be reduced or prevented.

In some exemplary embodiments, the semiconductor dies 10F and the adhesive film 20B may become in close contact with the base film 30A due to the gas sprayed from the gas injection system 50.

Figure 8:
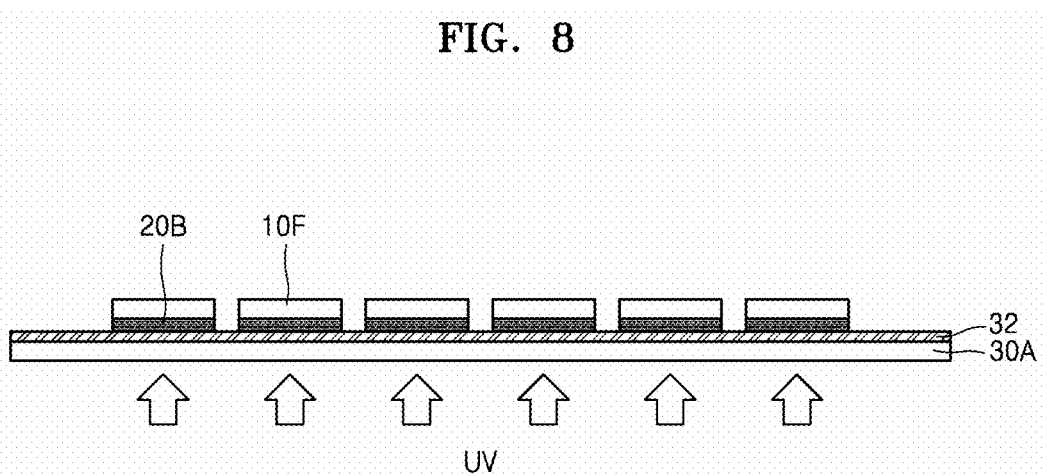
FIG. 8 is a lateral view of a stage on which the adhesion between the adhesive film and the base film is reduced or removed by irradiating ultraviolet (UV) rays to a base film.

FIG. 8 is a lateral view of a stage on which the adhesion between the adhesive film 20B and the base film 30A is reduced or removed by irradiating UV rays to the base film 30A.

Referring to FIG. 8, UV rays may be irradiated at the base film 30A to separate the semiconductor dies 10F from the base film 30A. The adhesion between the adhesive film 20B and the base film 30A is removed or reduced by the UV rays, and thus, the semiconductor dies 10F may be separated from the base film 30A. In an exemplary embodiment, as described above with reference to FIG. 3, a photoinitiator included in the adhesive releasing layer 32 may be activated by the UV rays and initiate a reaction decreasing the adhesion between the adhesive film 20B and the base film 30A.

The activation of the photoinitiator may be hindered in an atmosphere including oxygen. For example, even though UV rays are radiated, the reaction initiated by the photoinitiator of the adhesive releasing layer 32 may be hindered in an atmosphere, such as air (e.g., atmospheric air), including oxygen, and therefore, the adhesion between the adhesive film 20B and the base film 30A may be maintained instead of being reduced. Accordingly, due to oxygen present at the partition lanes, when UV rays are radiated in a state where the edge of the adhesive film 20B is detached from the base film 30A (e.g., partially detached state of the semiconductor dies 10F), adhesion is maintained at the portion adjacent to the detached portion. The semiconductor dies 10W and the adhesive film 20B, which have had warpage, may be relieved from the warpage several minutes to several tens of minutes later and may be in full physical contact with the base film 30A. In this case, the adhesive film 20B is still chemically attached to the base film 30A at the portion where the adhesion has been maintained, i.e., the portion just adjacent to where the detachment has occurred due to the warpage. As a result, when the semiconductor dies 10F are picked up in expectation of being easily separated due to the UV radiation, the semiconductor dies 10F may not be picked up or may be damaged because of the re-attached portion.

Therefore, in some embodiments, only when the adhesive film 20B is in full contact with the base film 30A, as shown in FIG. 8, before UV radiation, the photoinitiator of the adhesive releasing layer 32 may be normally activated. For example, only when the entire bottom surface of the adhesive film 20B is in contact with the top surface of the adhesive releasing layer 32 and the entire bottom surface of the adhesive releasing layer 32 is in contact with the top surface of the base film 30A, as shown in FIG. 8, before UV radiation, the photoinitiator of the adhesive releasing layer 32 may be normally activated. In addition, since adhesion is reduced throughout the whole area of the adhesive film 20B contacting the base film 30A because of UV radiation, the semiconductor dies 10F may normally and smoothly be picked up in a pick-up process afterward.

Figure 9:
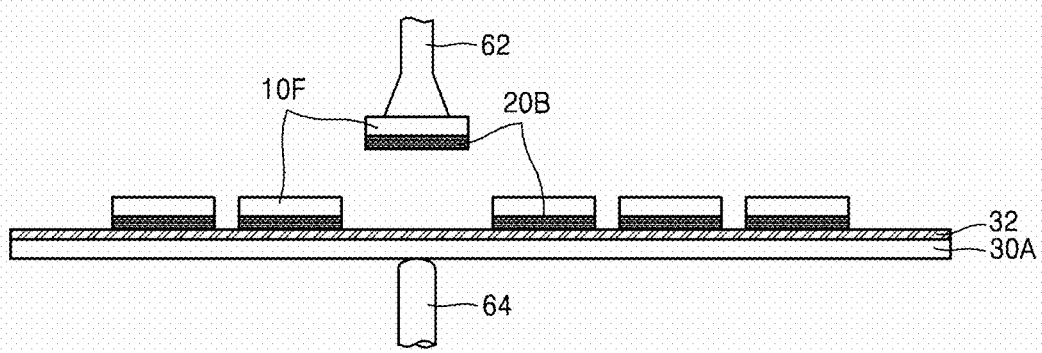
FIG. 9 is a lateral view of a stage on which a semiconductor die is picked up and detached from a base film.

FIG. 9 is a lateral view illustrating a semiconductor die 10F that is being picked up and detached from the base film 30A on a stage.

Referring to FIG. 9, while the semiconductor die 10F to be picked up is being supported by a needle 64, a collet 62 may vacuum-adsorb and lift up the semiconductor die 10F to detach the semiconductor die 10F from the base film 30A and may move the semiconductor die 10F to a desired position.

FIGS. 10A and 10B are lateral views for explaining a method of singulating the semiconductor dies 10W, according to an exemplary embodiment of the inventive concept.

The embodiment illustrated in FIG. 10A is substantially the same as that illustrated in FIG. 6 with the exception of spraying gas from below the base film 30A. Thus, redundant descriptions will be omitted, and differences will be described below.

A first gas may be sprayed toward the tops of the semiconductor dies 10W by a first gas injection system 50A provided above the protective film 40. A first pressure P1 may be applied to the tops of the semiconductor dies 10W by the spraying of the first gas. The first gas may be sprayed toward the tops of the semiconductor dies 10W through nozzles 54A formed in a body 52A.

A second gas may be sprayed toward the bottoms of the semiconductor dies 10W in a direction opposite to the sprayed direction of the first gas by a second gas injection system 50B provided below the base film 30A. A second pressure P2 may be applied to the bottoms of the semiconductor dies 10W by the spraying of the second gas. The second gas may be sprayed toward the bottoms of the semiconductor dies 10W through nozzles 54B formed in a body 52B. The first pressure P1 may be equal to or greater than the second pressure P2.

Referring to FIG. 10B, the warpage of the semiconductor dies 10F and the adhesive film 20B may be reduced or alleviated by the first gas and the second gas respectively sprayed from the first and second gas injection systems 50A and 50B. Accordingly, detachment of the semiconductor dies 10F and the adhesive film 20B from the base film 30A may be reduced or prevented.

In some exemplary embodiments, the semiconductor dies 10F and the adhesive film 20B may become in close contact with the base film 30A due to the first and second gases respectively sprayed from the first and second gas injection systems 50A and 50B.

Subsequent processes are the same as those described with reference to FIGS. 8 and 9. Thus, redundant descriptions will be omitted.

Figure 11A:
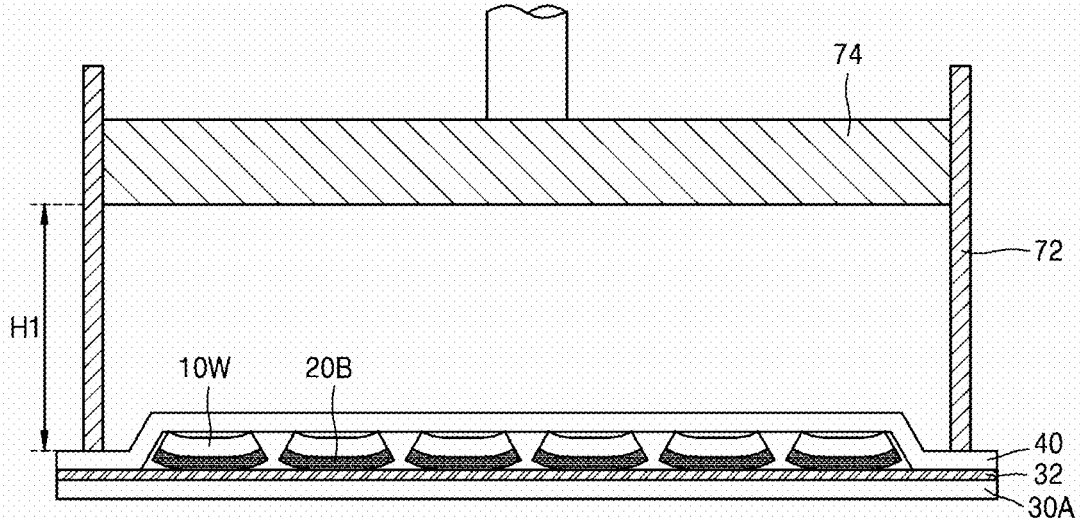
FIGS. 11A and 11B are lateral views for explaining a method of singulating semiconductor dies, according to some example embodiments of the inventive concept.
Figure 11B:
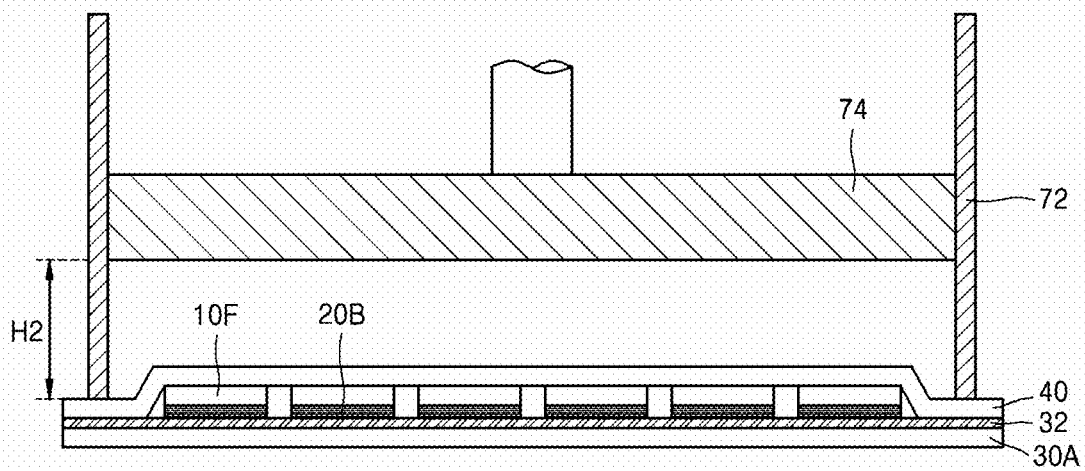

FIGS. 11A and 11B are lateral views for explaining a method of singulating the semiconductor dies 10W, according to some exemplary embodiments of the inventive concept.

Referring to FIG. 11A, a sidewall 72 surrounding the semiconductor dies 10W and a piston 74 movable up and down along the sidewall 72 above the semiconductor dies 10W may be provided. In this exemplary embodiment, the protective film 40 may be provided at the tops of the semiconductor dies 10W.

The sidewall 72 may be in close contact with a top surface of the protective film 40. For example, the entire bottom surface of the sidewall 72 may be in contact with the top surface of the protective film 40. A pressure in an inner space defined by the sidewall 72, the piston 74, and the protective film 40 may be substantially the same as a pressure outside the sidewall 72. In this exemplary embodiment, the piston 74 may have a height H1.

Referring to FIG. 11B, the height of the piston 74 may be reduced to a height H2 to increase the pressure in the inner space. Since the inner space is substantially sealed, the pressure in the inner space may be increased as the height of the piston 74 is reduced to the height H2. For example, as the height of the piston 74 is reduced, the pressure in the inner space is increased.

When the pressure in the inner space is increased, the increased pressure may be transmitted to the semiconductor dies 10W through the protective film 40, so that the warpage of the semiconductor dies 10W and the adhesive film 20B may be reduced or alleviated by the transmitted pressure.

When the protective film 40 does not exist, the warpage of the semiconductor dies 10W and the adhesive film 20B is not reduced or alleviated even if the pressure in the inner space is increased. This is because the increased pressure in the inner space is applied to not only the top surfaces of the semiconductor dies 10W but also bottom surfaces of portions of the adhesive film 20B detached from the base film 30A.

Accordingly, the protective film 40 may be needed when the sidewall 72 and the piston 74 are used, as shown in FIGS. 11A and 11B.

Subsequent processes are the same as those described with reference to FIGS. 8 and 9. Thus, redundant descriptions will be omitted.

When using a method of singulating semiconductor dies and a method of fabricating a semiconductor package, according to example embodiments of the inventive concept, device reliability may be increased and a failure rate may be decreased.

Figure 12:
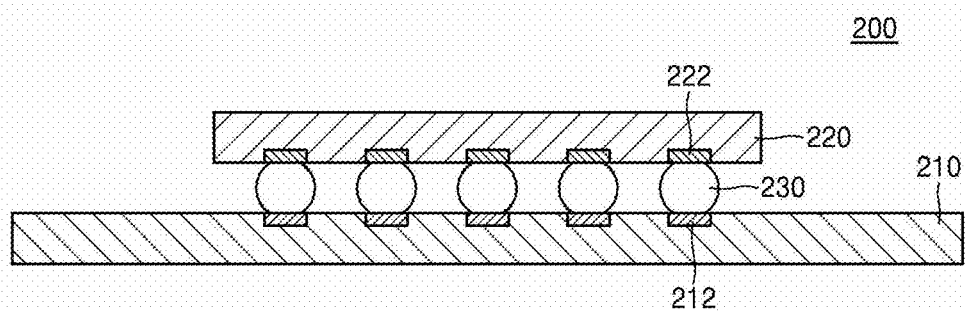
FIG. 12 is a diagram of a semiconductor package fabricated according to an example embodiment of the inventive concept.

FIG. 12 is a diagram of a semiconductor package 200 fabricated according to an exemplary embodiment of the inventive concept.

Referring to FIG. 12, a semiconductor die 220 may be mounted on a package substrate 210. The semiconductor die 220 may be the semiconductor die 10F picked up by the collet 62 in FIG. 9. The semiconductor die 220 may be flash memory, phase-change random access memory (PRAM), resistive RAM (PRAM), ferroelectric RAM (FeRAM), magnetic RAM (MRAM), a logic device, or a controller but is not limited thereto. The flash memory may be NAND flash memory.

A plurality of first terminals 212 may be formed in the package substrate 210. The package substrate 210 may be a printed circuit board (PCB) or a flexible PCB (FPCB).

The first terminals 212 may be bump pads of which each may have a bump bonded thereto. The first terminals 212 may have a structure of a single metal layer or a structure in which a plurality of metals are stacked. The first terminals 212 may include copper (Cu), aluminum (Al), nickel (Ni), or an alloy of at least two elements thereof, but the inventive concept is not limited thereto.

The semiconductor die 220 may include a plurality of second terminals 222 respectively corresponding to the first terminals 212. Each of the second terminals 222 may be connected to a corresponding one of the first terminals 212 by a solder bump 230.

The various pads of a device described herein may be conductive terminals connected to internal wiring and/or logic circuits of the device, and may transmit signals and/or supply voltages between an internal wiring and/or internal circuit of the device and an external source. For example, bump pads of the semiconductor die 220 may electrically connect to and transmit supply voltages and/or signals between an integrated circuit of the semiconductor die 220 and a device to which the semiconductor die 220 is connected. The various pads may be provided on or near an external surface of the device and may generally have a planar surface area (often larger than a corresponding surface area of the internal wiring to which they are connected) to promote connection to a further terminal, such as a bump or solder ball, and/or an external wiring.

Figure 13:
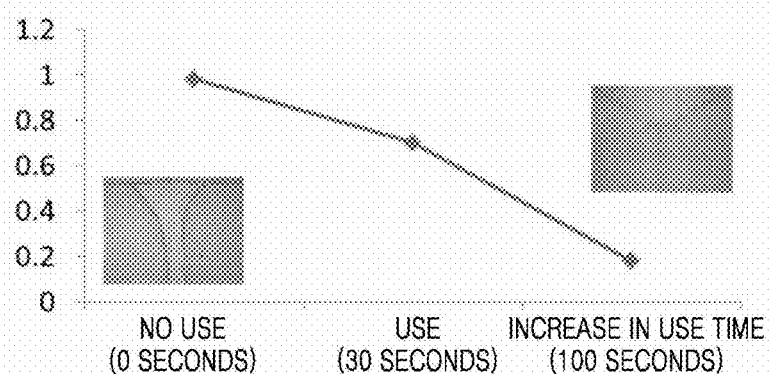
FIG. 13 is a graph showing test results of a method of alleviating warpage by spraying gas according to an example embodiment of the inventive concept.

To verify the effect of a method of irradiating UV rays after alleviating warpage by applying a pressure as described above, fixation areas were measured and compared with respect to cases of not using gas spraying, of spraying gas for 30 seconds, and of spraying gas for 100 seconds, and the comparison result is shown in FIG. 13.

Air was sprayed as the gas. The case of spraying gas for 30 seconds was different from the case of spraying gas for 100 seconds in terms of only spraying time. A fixation area was measured using a trace of fixation remaining in a base film.

Referring to FIG. 13, fixation areas are expressed as percentages with respect to the area of a semiconductor die with respect to the cases of not using air spraying, of spraying the air for 30 seconds, and of spraying the air for 100 seconds.

As a result, while the percentage of a fixation area was about 1% in the case of not using air spraying, the percentage of a fixation area was about 0.7% in the case of spraying the air for 30 seconds. In addition, the percentage of a fixation area was decreased to about 0.2% in the case of spraying the air for 100 seconds.

Therefore, it has been verified that when warpage of a semiconductor die is removed by applying a pressure to the semiconductor die, a fixation area may be decreased, and furthermore, a failure rate may be decreased and device reliability may be increased.

While the inventive concept has been particularly shown and described with reference to example embodiments thereof, it will be understood that various changes in form and details may be made therein without departing from the spirit and scope of the following claims.

What is claimed is:

1. A method of fabricating a semiconductor package, the method comprising:
    providing a substrate on a stage, the substrate including semiconductor dies and a modified layer along a partition lane and sequentially having an adhesive film and a base film on a surface thereof so that bottom surfaces of the adhesive film and the base film face the stage and top surfaces of the adhesive film and the base film face away from the stage and the bottom surface of the adhesive film faces the top surface of the base film;
    separating the semiconductor dies from each other by applying a force to the substrate in a lateral direction;
    applying a gas pressure to a top surface of each of the semiconductor dies; and
    irradiating ultraviolet rays toward the adhesive film after applying the gas pressure on the top surface of each of the semiconductor dies.

2. The method of claim 1, wherein the modified layer is a region in which silicon included in the substrate is melted and resolidified after irradiating a laser beam to the substrate.

3. The method of claim 1, wherein the step of applying of the pressure to the top surface of each of the semiconductor dies comprises spraying a gas toward the top surface of each of the semiconductor dies.

4. The method of claim 3, further comprising, between the steps of separating of the semiconductor dies and the spraying of the gas:
    positioning a protective film to cover the semiconductor dies.

5. The method of claim 4, wherein the step of spraying of the gas comprises spraying the gas toward the semiconductor dies with the protective film between the gas and the semiconductor dies.

6. The method of claim 5, wherein during the spraying of the gas, the sprayed gas enables the protective film to be in contact with the semiconductor dies and the protective film transmits the gas pressure applied by the gas to the semiconductor dies.

7. The method of claim 1, wherein the step of applying of the gas pressure to the top surface of the semiconductor dies comprises:
    spraying a first gas toward the top surface of the semiconductor dies; and
    spraying a second gas toward a bottom surface of the semiconductor dies in a direction opposite a sprayed direction of the first gas, and
    a first gas pressure applied to the top surface of the semiconductor dies by the first gas is equal to or greater than a second gas pressure applied to the bottom surface of the semiconductor dies by the second gas.

8. The method of claim 1, wherein the step of applying of the gas pressure to the top surface of the semiconductor dies comprises:
    providing a sidewall and a piston at the stage, the sidewall surrounding the substrate, and the piston being movable up and down along the sidewall above the substrate; and
    applying the gas pressure to the semiconductor dies by allowing the piston to approach the substrate.

9. The method of claim 8, further comprising:
    positioning a protective film between the piston and the semiconductor dies to cover the semiconductor dies before applying the gas pressure to the semiconductor dies.

10. The method of claim 1, wherein the step of separating of the semiconductor dies comprises expanding the base film in the lateral direction.

11. The method of claim 10, wherein the semiconductor dies are separated from each other by a predetermined distance in the lateral direction by the expanding of the base film in the lateral direction.

12. The method of claim 11, wherein the adhesive film and the semiconductor dies separated by the separating of the semiconductor dies are partially detached from the base film due to warpage spontaneously occurring in the semiconductor dies and the adhesive film, and detachment of the semiconductor dies and the adhesive film from the base film is reduced or alleviated by the applying of the gas pressure.

13. The method of claim 1, wherein the step of applying of the pressure is performed in a nitrogen ($N_2$) atmosphere or an inert gas atmosphere.

14. A method of singulating semiconductor dies for fabricating a semiconductor package, the method comprising:
    separating the semiconductor dies from each other in a substrate by applying a force to the substrate in a lateral direction, the substrate including a modified layer along a partition lane and the semiconductor dies which have not been separated from each other yet;
    after the separating, covering the semiconductor dies with a protective film; and
    applying a gas pressure to a top surface of the protective film to apply the gas pressure to the semiconductor dies.

15. The method of claim 14, wherein warpage spontaneously occurring in the semiconductor dies separated by the separating of the semiconductor dies is reduced or removed by the gas pressure applied to the semiconductor dies during the applying of the gas pressure.

16. The method of claim 15, further comprising:
    attaching an adhesive film to a surface of the substrate before the step of separating of the semiconductor dies; and
    irradiating ultraviolet rays to the adhesive film after the step of applying of the gas pressure to the top surface of the protective film.

17. The method of claim 14, wherein the protective film is a flexible film that comes in contact with top and side surfaces of the semiconductor dies.

18. A method of singulating semiconductor dies for fabricating a semiconductor package, the method comprising:
    forming a modified layer along a partition lane of a substrate including semiconductor dies which have not been separated from each other;

sequentially attaching an adhesive film and a base film to a surface of the substrate so that a bottom surface of the adhesive film faces a top surface of the base film;

separating the semiconductor dies from each other by applying a force to the substrate in a lateral direction;

applying a gas pressure to the semiconductor dies to reduce or remove warpage spontaneously occurring in the semiconductor dies separated in the separating of the semiconductor dies;

irradiating ultraviolet rays toward the adhesive film after applying the gas pressure to the semiconductor dies; and separating the adhesive film from the base film.

19. The method of claim 18, wherein the step of applying of the pressure comprises spraying a gas toward the semiconductor dies.

20. The method of claim 18, wherein the forming of the modified layer comprises irradiating a laser beam to the substrate.

* * * * *